United States Patent
Ho et al.

(10) Patent No.: US 9,847,434 B2
(45) Date of Patent: Dec. 19, 2017

(54) MULTICHANNEL RECEIVER OPTICAL SUBASSEMBLY WITH IMPROVED SENSITIVITY

(71) Applicant: Applied Optoelectronics, Inc., Sugar Land, TX (US)

(72) Inventors: I-Lung Ho, Sugar Land, TX (US); Chong Wang, Stafford, TX (US); Luohan Peng, Cypress, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 15 days.

(21) Appl. No.: 14/665,639

(22) Filed: Mar. 23, 2015

(65) Prior Publication Data
US 2016/0284874 A1   Sep. 29, 2016

(51) Int. Cl.
*H04B 10/69* (2013.01)
*H01L 31/0203* (2014.01)
*H04B 10/40* (2013.01)
*G02B 6/00* (2006.01)

(52) U.S. Cl.
CPC ............ *H01L 31/0203* (2013.01); *G02B 6/00* (2013.01); *H04B 10/40* (2013.01)

(58) Field of Classification Search
CPC .............................. H04B 10/69; H04B 10/697
See application file for complete search history.

(56) References Cited

U.S. PATENT DOCUMENTS

| 6,177,665 | B1 | 1/2001 | Wolf |
| 6,242,732 | B1 * | 6/2001 | Rantakari ............ H03G 3/3084 |
| | | | 250/214 A |
| 6,493,121 | B1 | 12/2002 | Althaus |
| 6,796,715 | B2 | 9/2004 | Chiu et al. |
| 7,330,619 | B2 | 2/2008 | Vernooy et al. |
| 2005/0018177 | A1 | 1/2005 | Rosenberg et al. |
| 2005/0040892 | A1 | 2/2005 | Seetharaman et al. |
| 2005/0121736 | A1 | 6/2005 | Wang et al. |
| 2005/0123300 | A1 | 6/2005 | Kim et al. |

(Continued)

OTHER PUBLICATIONS

PCT International Search Report dated Oct. 3, 2014, received in related PCT Application No. PCT/US14/37801, 14 pgs.

(Continued)

*Primary Examiner* — Shi K Li
(74) *Attorney, Agent, or Firm* — Grossman Tucker Perreault & Pfleger, PLLC; Norman S. Kinsella (57) ABSTRACT

A multi-channel receiver optical subassembly (ROSA) such as an arrayed waveguide grating (AWG), with outputs directly optically coupled to respective photodetectors such as photodiodes. In one embodiment, the photodetectors are mounted on a photodetector mounting bar that includes a multiple conductive photodetector pads (PD pads). Each of the PD pads may be configured to receive a photodetector, and the PD pads are electrically isolated from ground such that the photodetectors are floating. The photodetector bar further includes multiple conductive transimpedance amplifier pads (TIA pads). Each of the TIA pads may be configured to receive a TIA, associated with one of the photodetectors, and to be electrically coupled to one or more ground ports of the TIA. The TIA pads are electrically connected to a common ground shared be each of said TIAs.

27 Claims, 8 Drawing Sheets

(56) References Cited

U.S. PATENT DOCUMENTS

| | | |
|---|---|---|
| 2005/0213994 A1 | 9/2005 | Dudek et al. |
| 2006/0088255 A1 | 4/2006 | Wu et al. |
| 2006/0171642 A1 | 8/2006 | Tamanuki et al. |
| 2006/0228077 A1* | 10/2006 | Gilkerson ............ G02B 6/4225 385/91 |
| 2007/0053698 A1* | 3/2007 | Margaritis ......... H04B 10/1123 398/202 |
| 2007/0237449 A1 | 10/2007 | Aoki et al. |
| 2008/0069570 A1 | 3/2008 | Dallesasse |
| 2008/0088255 A1 | 4/2008 | Wang et al. |
| 2008/0171642 A1 | 7/2008 | Cassidy et al. |
| 2008/0240735 A1 | 10/2008 | Bossard |
| 2009/0003826 A1* | 1/2009 | Jeon .................... H05K 9/0058 398/43 |
| 2009/0202256 A1 | 8/2009 | Chen |
| 2009/0220248 A1 | 9/2009 | Hudgins |
| 2010/0322569 A1 | 12/2010 | Ohyama et al. |
| 2011/0058771 A1* | 3/2011 | Lee ..................... G02B 6/4215 385/33 |
| 2012/0087678 A1 | 4/2012 | Earnshaw |
| 2012/0170944 A1 | 7/2012 | Yagisawa et al. |
| 2012/0189323 A1 | 7/2012 | Xu et al. |
| 2013/0039662 A1* | 2/2013 | Brooks ............. G02B 6/12007 398/91 |
| 2013/0084070 A1 | 4/2013 | Ho et al. |
| 2014/0161394 A1 | 6/2014 | Ho et al. |
| 2014/0175266 A1* | 6/2014 | Wu ...................... H05K 1/0243 250/208.2 |
| 2014/0341578 A1 | 11/2014 | Ho et al. |
| 2015/0063832 A1* | 3/2015 | Park .................... G02B 6/4274 398/214 |
| 2016/0154177 A1* | 6/2016 | Han ........................ G02B 6/12 385/14 |

OTHER PUBLICATIONS

PCT International Search Report dated Apr. 8, 2015, received in related PCT Application No. PCT/US14/67241, 13 pgs.

U.S. Office Action dated Apr. 30, 2015, received in related U.S. Appl. No. 14/088,883, 43 pgs.

PCT International Search Report and Written Opinion dated Jun. 10, 2016, received in corresponding PCT Application No. PCT/US16/023703, 10 pgs.

EP Search Report dated Jul. 6, 2017, received in related EP Application No. 14871745.7, 9 pgs.

Doi, Y. et al, "Flat and high responsivity CWDM photoreceiver using silica-based AWG with multimode output waveguides", Electronics Letters, Oct. 30, 2003, vol. 39, No. 22, 2 pgs.

* cited by examiner

MULTICHANNEL RECEIVER OPTICAL SUBASSEMBLY WITH IMPROVED SENSITIVITY

TECHNICAL FIELD

The present disclosure relates to optical transceivers and more particularly, to a multi-channel receiver optical subassembly (ROSA) with improved sensitivity due to reduced crosstalk between photodetectors through the use of floating grounds.

BACKGROUND INFORMATION

Optical communications networks, at one time, were generally "point to point" type networks including a transmitter and a receiver connected by an optical fiber. Such networks are relatively easy to construct but deploy many fibers to connect multiple users. As the number of subscribers connected to the network increases and the fiber count increases rapidly, deploying and managing many fibers becomes complex and expensive.

A passive optical network (PON) addresses this problem by using a single "trunk" fiber from a transmitting end of the network, such as an optical line terminal (OLT), to a remote branching point, which may be up to 20 km or more. One challenge in developing such a PON is utilizing the capacity in the trunk fiber efficiently in order to transmit the maximum possible amount of information on the trunk fiber. Fiber optic communications networks may increase the amount of information carried on a single optical fiber by multiplexing different optical signals on different wavelengths using wavelength division multiplexing (WDM). In a WDM-PON, for example, the single trunk fiber carries optical signals at multiple channel wavelengths to and from the optical branching point and the branching point provides a simple routing function by directing signals of different wavelengths to and from individual subscribers. In this case, each subscriber may be assigned one or more of the channel wavelengths on which to send and/or receive data.

To transmit and receive optical signals over multiple channel wavelengths, the OLT in a WDM-PON may include a multi-channel transmitter optical subassembly (TOSA), a multi-channel receiver optical subassembly (ROSA), and associated circuitry. In the ROSA, multiple photodiodes are optically coupled to multiple outputs from an optical demultiplexer, such as an arrayed waveguide grating (AWG), for receiving multiple optical signals over multiple channels. The photodiodes convert these optical signals to electrical signals which are then typically provided to an amplifier circuit. One challenge with such OLT transceiver modules is accommodating the multi-channel TOSA, ROSA and circuitry in the relatively small space available in an OLT module. Designing a subassembly, such as the ROSA, with a smaller size presents potential problems including, for example, increased cross talk between photodiodes on multiple channels due to the reduced spacing between channels. Limitations on the power budget of multiple channel optical transceivers present an additional challenge because higher receiver sensitivity may be required but difficult to achieve with the increased crosstalk.

BRIEF DESCRIPTION OF THE DRAWINGS

These and other features and advantages will be better understood by reading the following detailed description, taken together with the drawings wherein.

DETAILED DESCRIPTION

A multi-channel receiver optical subassembly (ROSA), consistent with embodiments described herein, includes an optical demultiplexer, such as an arrayed waveguide grating (AWG), with outputs optically coupled to respective photodetectors such as photodiodes (including PIN type photodiodes). In one embodiment, the photodetectors may be mounted on a photodetector mounting bar in a floating ground configuration to reduce cross talk between photodetectors, as will be explained in greater detail below. The photodetectors may be coupled to associated transimpedance amplifiers (TIAs) which are configured to share a common ground to further reduce crosstalk and improve receiver sensitivity. Additionally, the wire bonding that couples the photodetectors to the TIAs may be configured to a shortened length to achieve still further reduction in crosstalk. A compact multi-channel optical transceiver may include the multi-channel ROSA, and the optical transceiver may be used in a wavelength division multiplexed (WDM) optical system, for example, in an optical line terminal (OLT) in a WDM passive optical network (PON).

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. The term "coupled" as used herein refers to any connection, coupling, link or the like and "optically coupled" refers to coupling such that light from one element is imparted to another element. The term "directly optically coupled" refers to an optical coupling without any intermediate optical components such as lenses or fiber arrays.

Figure 1:
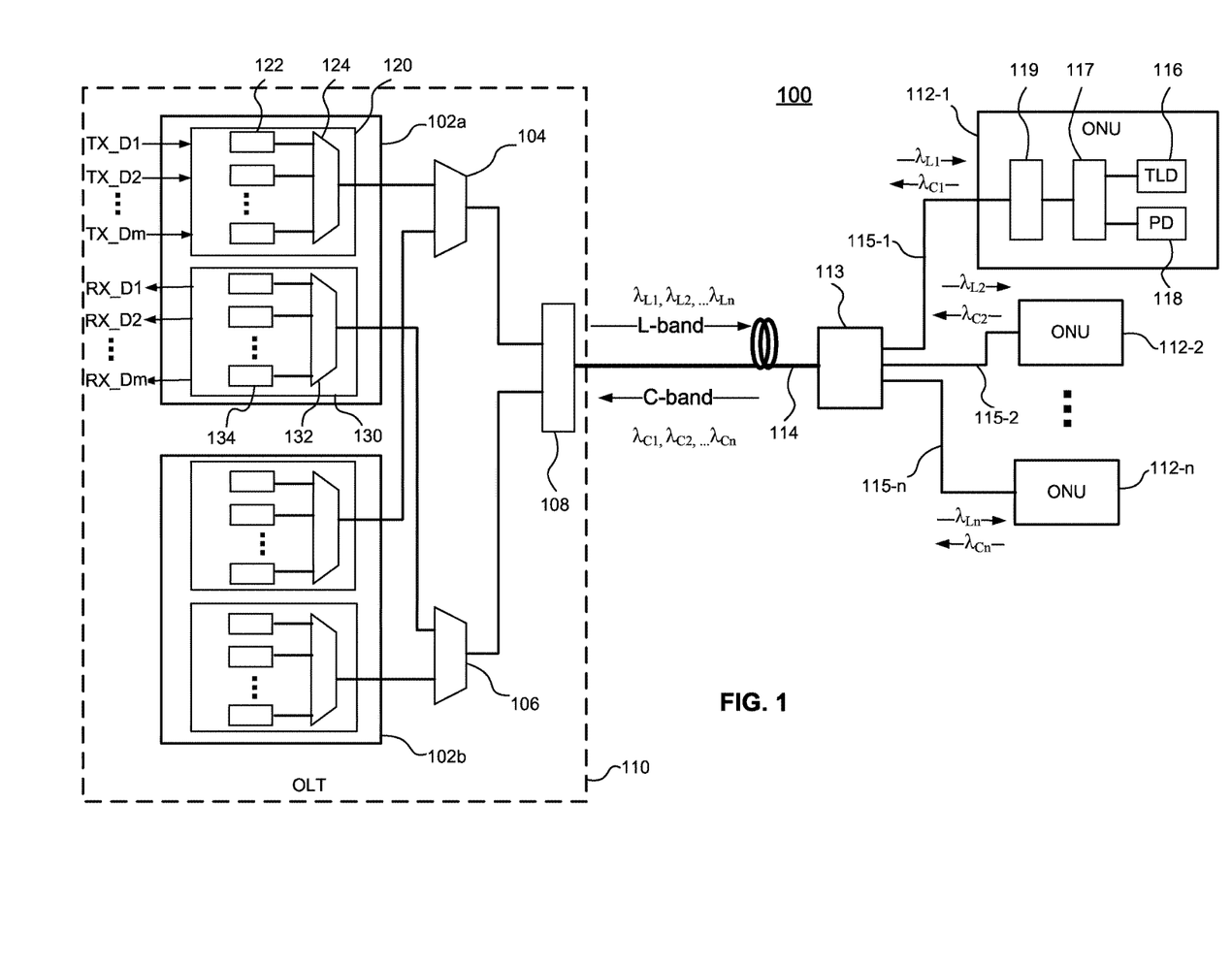
FIG. 1 is a functional block diagram of a wavelength division multiplexed (WDM) passive optical network (PON) including at least one compact multi-channel optical transceiver, consistent with embodiments of the present disclosure.

Referring to FIG. 1, a WDM-PON 100 including one or more multi-channel optical transceivers 102a, 102b, consistent with embodiments of the present disclosure, is shown and described. The WDM-PON 100 provides a point-to-multipoint optical network architecture using a WDM system. According to one embodiment of the WDM-PON 100, at least one optical line terminal (OLT) 110 may be coupled to a plurality of optical networking terminals (ONTs) or optical networking units (ONUs) 112-1 to 112-n via optical fibers, waveguides, and/or paths 114, 115-1 to 115-n. Although the OLT 110 includes two multi-channel optical transceivers 102a, 102b in the illustrated embodiment, the OLT 110 may include one or more multi-channel optical transceivers.

The OLT 110 may be located at a central office of the WDM-PON 100, and the ONUs 112-1 to 112-n may be located in homes, businesses or other types of subscriber location or premises. A branching point 113 (e.g., a remote node) couples a trunk optical path 114 to the separate optical paths 115-1 to 115-n to the ONUs 112-1 to 112-n at the respective subscriber locations. The branching point 113 may include one or more passive coupling devices such as a splitter or optical multiplexer/demultiplexer. In one example, the ONUs 112-1 to 112-n may be located about 20 km or less from the OLT 110.

The WDM-PON 100 may also include additional nodes or network devices, such as Ethernet PON (EPON) or Gigabit PON (GPON) nodes or devices, coupled between the branching point 113 and ONUs 112-1 to 112-n at different locations or premises. One application of the WDM-PON 100 is to provide fiber-to-the-home (FTTH) or fiber-to-the-premises (FTTP) capable of delivering voice, data, and/or video services across a common platform. In this application, the central office may be coupled to one or more sources or networks providing the voice, data and/or video.

In the WDM-PON 100, different ONUs 112-1 to 112-n may be assigned different channel wavelengths for transmitting and receiving optical signals. In one embodiment, the WDM-PON 100 may use different wavelength bands for transmission of downstream and upstream optical signals relative to the OLT 110 to avoid interference between the received signal and back reflected transmission signal on the same fiber. For example, the L-band (e.g., about 1565 to 1625 nm) may be used for downstream transmissions from the OLT 110 and the C-band (e.g., about 1530 to 1565 nm) may be used for upstream transmissions to the OLT 110. The upstream and/or downstream channel wavelengths may generally correspond to the ITU grid. In one example, the upstream wavelengths may be aligned with the 100 GHz ITU grid and the downstream wavelengths may be slightly offset from the 100 GHz ITU grid.

The ONUs 112-1 to 112-n may thus be assigned different channel wavelengths within the L-band and within the C-band. Transceivers or receivers located within the ONUs 112-1 to 112-n may be configured to receive an optical signal on at least one channel wavelength in the L-band (e.g., $\lambda_{L1}$, $\lambda_{L2}$, ... $\lambda_{Ln}$). Transceivers or transmitters located within the ONUs 112-1 to 112-n may be configured to transmit an optical signal on at least one channel wavelength in the C-band (e.g., $\lambda_{C1}$, $\lambda_{C2}$, ... $\lambda_{Cn}$). Other wavelengths and wavelength bands are also within the scope of the system and method described herein.

The branching point 113 may demultiplex a downstream WDM optical signal (e.g., $\lambda_{L1}$, $\lambda_{L2}$, ... $\lambda_{Ln}$) from the OLT 110 for transmission of the separate channel wavelengths to the respective ONUs 112-1 to 112-n. Alternatively, the branching point 113 may provide the downstream WDM optical signal to each of the ONUs 112-1 to 112-n and each of the ONUs 112-1 to 112-n separates and processes the assigned optical channel wavelength. The branching point 113 also combines or multiplexes the upstream optical signals from the respective ONUs 112-1 to 112-n for transmission as an upstream WDM optical signal (e.g., $\lambda_{C1}$, $\lambda_{C2}$, ... $\lambda_{Cn}$) over the trunk optical path 114 to the OLT 110.

One embodiment of the ONU 112-1 includes a laser 116, such as a laser diode, for transmitting an optical signal at the assigned upstream channel wavelength ($\lambda_{C1}$) and a photodetector 118, such as a photodiode, for receiving an optical signal at the assigned downstream channel wavelength ($\lambda_{L1}$). The laser 116 may include a tunable laser configured to be tuned to the assigned channel wavelength. This embodiment of the ONU 112-1 may also include a diplexer 117 coupled to the laser 116 and the photodetector 118 and a C+L band filter 119 coupled to the diplexer 117, which allow the L-band channel wavelength ($\lambda_{L1}$) to be received by the ONU 112-1 and the C-band channel wavelength ($\lambda_{C1}$) to be transmitted by the ONU 112-1.

The OLT 110 may be configured to generate multiple optical signals at different channel wavelengths (e.g., $\lambda_{L1}$, $\lambda_{L2}$, ... $\lambda_{Ln}$) and to combine the optical signals into the downstream WDM optical signal carried on the trunk optical fiber or path 114. Each of the OLT multi-channel optical transceivers 102a, 102b may include a multi-channel transmitter optical subassembly (TOSA) 120 for generating and combining the optical signals at the multiple channel wavelengths. The OLT 110 may also be configured to separate optical signals at different channel wavelengths (e.g., $\lambda_{C1}$, $\lambda_{C2}$, ... $\lambda_{Cn}$) from an upstream WDM optical signal carried on the trunk path 114 and to receive the separated optical signals. Each of the OLT multi-channel optical transceivers 102a, 102b may thus include a multi-channel receiver optical subassembly (ROSA) 130 for separating and receiving the optical signals at multiple channel wavelengths. As will be described in greater detail below, the multi-channel TOSA 120 and ROSA 130 are configured and arranged to fit within a relatively small transceiver housing and to facilitate heat transfer within the transceiver housing.

One embodiment of the multi-channel TOSA 120 includes an array of lasers 122, such as laser diodes, which may be modulated by respective RF data signals (TX_D1 to TX_Dm) to generate the respective optical signals. The lasers 122 may be modulated using various modulation techniques including external modulation and direct modulation. An optical multiplexer 124, such as an arrayed waveguide grating (AWG), combines the optical signals at the different respective downstream channel wavelengths (e.g., $\lambda_{L1}$, $\lambda_{L2}$, ... $\lambda_{Lm}$).

In some embodiments, the lasers 122 may be tunable lasers that generate the optical signals at the respective channel wavelengths. In other embodiments, the lasers 122 may generate optical signals over a band of channel wavelengths and filtering and/or multiplexing techniques may be used to produce the assigned channel wavelengths. In the illustrated embodiment, the OLT 110 further includes a multiplexer 104 for multiplexing the multiplexed optical signal from the multi-channel TOSA 120 in the multi-channel transceiver 102a with a multiplexed optical signal from a multi-channel TOSA in the other multi-channel transceiver 102b to produce the downstream aggregate WDM optical signal.

One embodiment of the multi-channel ROSA 130 includes a demultiplexer 132 for separating the respective upstream channel wavelengths (e.g., $\lambda_{C1}, \lambda_{C2}, \ldots \lambda_{Cn}$). An array of photodetectors 134, such as photodiodes, detects the optical signals at the respective separated upstream channel wavelengths and provides the received data signals (RX_D1 to RX_Dm). In the illustrated embodiment, the OLT 110 further includes a demultiplexer 106 for demultiplexing the upstream WDM optical signal into first and second WDM optical signals provided to the respective multi-channel ROSA in each of the transceivers 102a, 102b. The OLT 110 also includes a diplexer 108 between the trunk path 114 and the multiplexer 104 and the demultiplexer 106 such that the trunk path 114 carries both the upstream and the downstream channel wavelengths. The transceivers 102a, 102b may also include other components, such as laser drivers, transimpedance amplifiers (TIAs), and control interfaces, used for transmitting and receiving optical signals.

In one example, each of the multi-channel optical transceivers 102a, 102b may be configured to transmit and receive 16 channels such that the WDM-PON 100 supports 32 downstream L-band channel wavelengths and 32 upstream C-band channel wavelengths. In one example, the downstream L-band link between the OLT transceivers 102a, 102b and the ONUs 112-1 to 112-n may support a power budget of at least about 26 dB and the upstream C-band link between the ONUs 112-1 to 112-n and the OLT transceivers 102a, 102b may support a power budget of at least about 23 dB.

Figure 2:
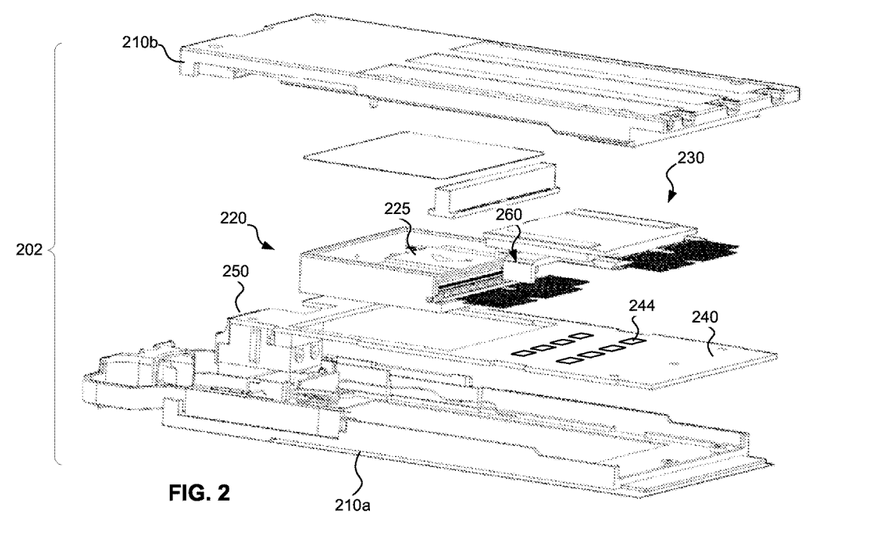
FIG. 2 is an exploded view of a compact multi-channel optical transceiver including a multi-channel TOSA, ROSA and circuit board, consistent with an embodiment of the present disclosure.
Figure 3:
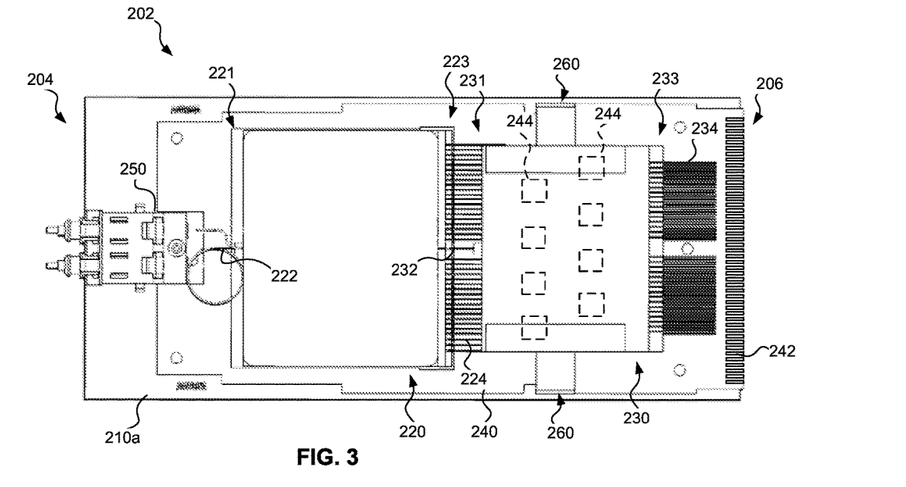
FIG. 3 is a top view inside the compact multi-channel optical transceiver shown in FIG. 2.

Referring to FIGS. 2 and 3, one embodiment of a compact multi-channel optical transceiver module 202 is shown and described in greater detail. As discussed above, multiple multi-channel transceiver modules may be used in an OLT of a WDM-PON to cover a desired channel range. The transceiver module 202 may thus be designed to have a relatively small form factor with minimal space. The compact optical transceiver module 202 generally provides an optical input and output at an optical connection end 204 and electrical input and output at an electrical connection end 206. The transceiver module 202 includes a transceiver housing 210a, 210b enclosing a multi-channel TOSA 220, a multi-channel ROSA 230, a circuit board 240, and a dual fiber adapter 250 directly linked to the TOSA 220 and the ROSA 230 for providing the optical input and output. The transceiver housing 210a, 210b may have a width of less than about 55 mm, a length of less than about 130 mm, and a height of less than about 10 mm. More specifically, one example of a transceiver housing 210 may have a width of 54.6 mm, a length of 110 mm, and a height of about 9.8 mm.

In the example embodiment, the TOSA 220 is located in the transceiver housing 210a, 210b proximate the optical connection end 204 and the ROSA 230 is located in the transceiver housing 210a, 210b proximate the electrical connection end 206. The circuit board 240 is located proximate the transceiver housing bottom portion 210a and extends to the electrical connection end 206. The ROSA 230 is located between the circuit board 240 and the transceiver housing top portion 210b.

The TOSA 220 and the ROSA 230 each have an optical connection end 221, 231 directed toward the transceiver optical connection end 204 and an electrical connection end 223, 233 directed toward the transceiver electrical connection end 206. The optical connection ends 221, 231 of the TOSA 220 and the ROSA 230 are optically coupled to the dual fiber adapter 250 with respective optical fibers 222, 232, respectively, to provide a direct link between the adapter 250 and both the TOSA 220 and the ROSA 230. The electrical connection ends 223, 233 of the TOSA 220 and the ROSA 230 are electrically connected to the circuit board 240 using TOSA pins 224 and ROSA pins 234, respectively, soldered to conductive pads on the circuit board 240. The circuit board 240 includes input/output conductive pads 242 proximate the transceiver electrical connection end 206. Input conductive pads 242 may be provided on one side of the circuit board 240 for providing RF input to the TOSA 220 and output conductive pads 242 may be provided on the other side of the circuit board 240 for providing output from the ROSA 230.

The multi-channel ROSA 230 includes a demultiplexer, such as an AWG, coupled to an array of photodetectors, such as photodiodes, as will be described in greater detail below. The printed circuit board 240 may include circuitry and electronic components such as laser diode drivers, transimpedance amplifiers (TIAs), control interfaces, and temperature control circuitry. In the example embodiment, the circuit board 240 includes integrated circuit (IC) components 244 electrically connected to the TOSA 220 and the ROSA 230, for example, using conductive traces on or in the circuit board 240. The IC components 244 are mounted on at least one side of the circuit board 240 between the circuit board 240 and the ROSA 230 and may also be mounted on the opposite side of the circuit board 240. The IC components 244 may be arranged on the circuit board 240 in one or more rows of IC components 244.

Examples of the TOSA and ROSA are described in greater detail in U.S. patent application Ser. No. 14/088,883 (U.S. Patent Application Pub. No. 2014/0341578), which is fully incorporated herein by reference.

Figure 4:
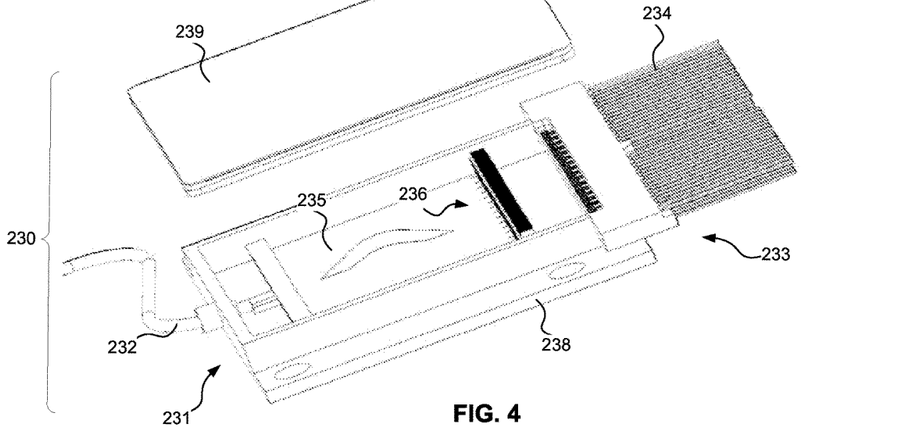
FIG. 4 is an exploded perspective view of a multi-channel ROSA for use in a compact multi-channel optical transceiver, consistent with an embodiment of the present disclosure.
Figure 5:
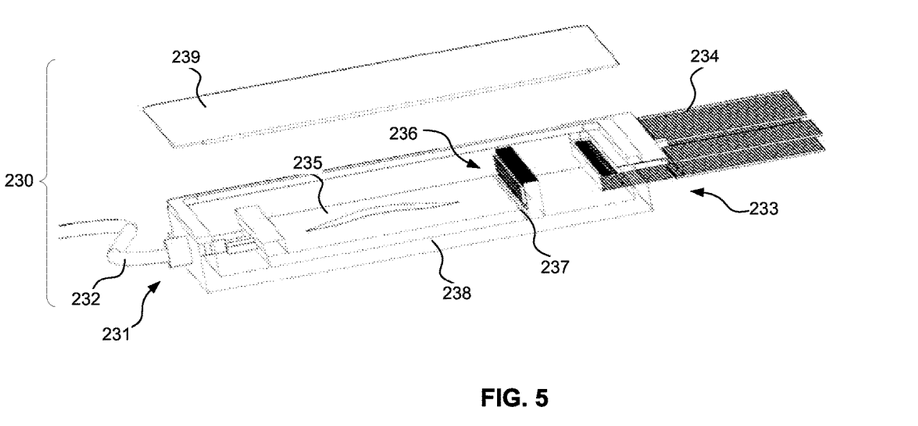
FIG. 5 is a cross-sectional view of the multi-channel ROSA shown in FIG. 4.
Figure 6:
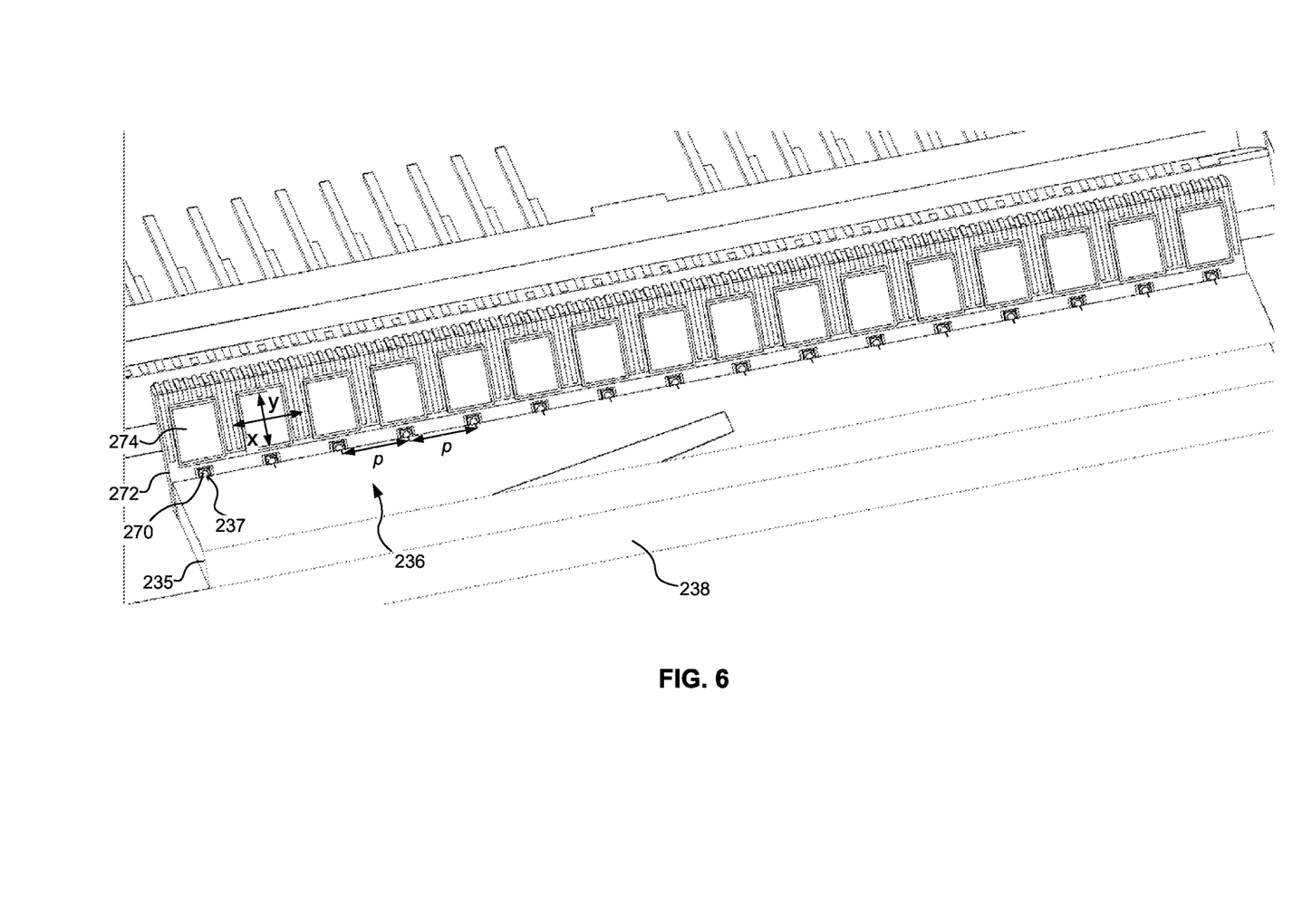
FIG. 6 is a cross-sectional front perspective view of the array of photodetectors directly optically coupled to the respective optical outputs of the optical demultiplexer in the ROSA shown in FIG. 4.
Figure 7:
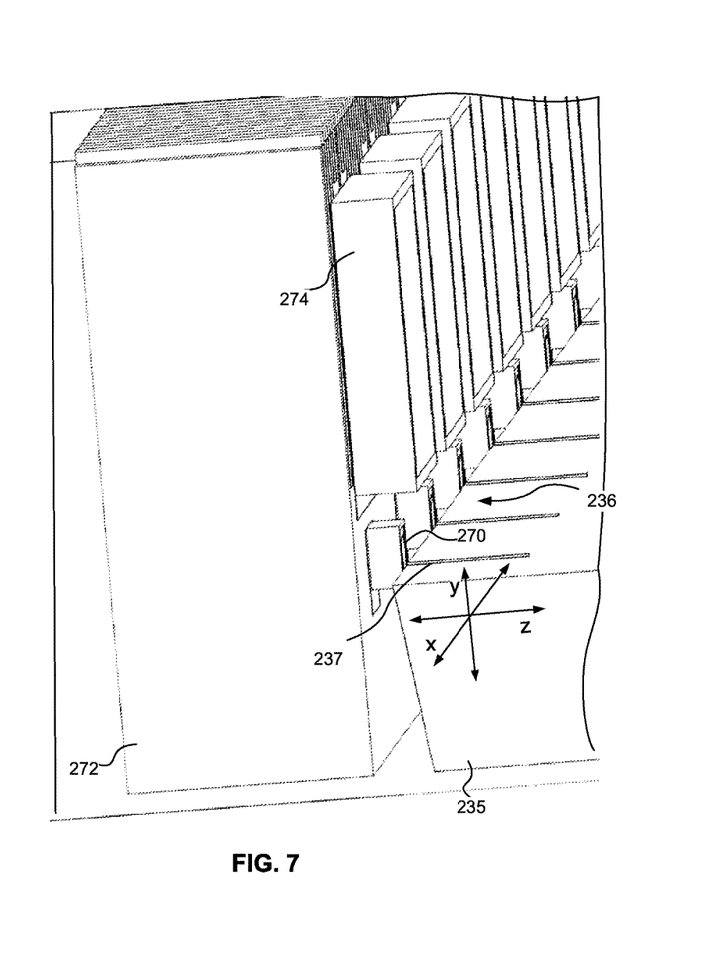
FIG. 7 is an enlarged, side perspective view of the array of photodetectors directly optically coupled to the respective optical outputs of the optical demultiplexer in the ROSA shown in FIG. 4.

Referring to FIGS. 4 and 5, an embodiment of the multi-channel ROSA 230 is described in greater detail. The ROSA 230 includes a demultiplexer 235, such as an AWG, mounted on a ROSA base portion 238. Optical outputs 237 of the demultiplexer 235 are optically coupled to an array of photodetectors 236, such as photodiodes. An input of the demultiplexer 235 is optically coupled to the input optical fiber 232 at the optical connection end 231 and the output of the photodetectors 236 are electrically connected to the ROSA pins 234 at the electrical connection end 233. A ROSA cover 239 covers the ROSA base portion 238 and encloses the demultiplexer 235 and array of photodetectors 236.

Referring to FIGS. 6-9, direct optical coupling of the array of photodetectors 236 to the respective optical outputs 237 of the optical demultiplexer 235 is shown and described in greater detail. In the illustrated embodiment, the array of photodetectors 236 may include PIN type photodiodes 270 mounted on a photodetector mounting bar 272 together with associated transimpedance amplifiers (TIAs) 274. The photodetectors (or photodiodes) 270 are aligned with and spaced from the optical outputs 237 of the demultiplexer 235 with a spacing that is close enough to achieve a coupling efficiency of 95% or greater with an alignment tolerance (i.e., in the X, Y axes) high enough to allow passive alignment (e.g., an alignment tolerance of at least about 20 microns). In one example, the photodiodes 270 may be spaced from the optical outputs 237 (i.e., in the Z axis) in a range of 10-40 microns, which allows a coupling efficiency greater than 95% and an alignment tolerance of about 20 microns. In the illustrated embodiment of a 16 channel ROSA, for example, 16 photodiodes 270 are aligned with 16 optical outputs 237 and electrically connected to 16 associated TIAs 274, respectively.

Figure 8:
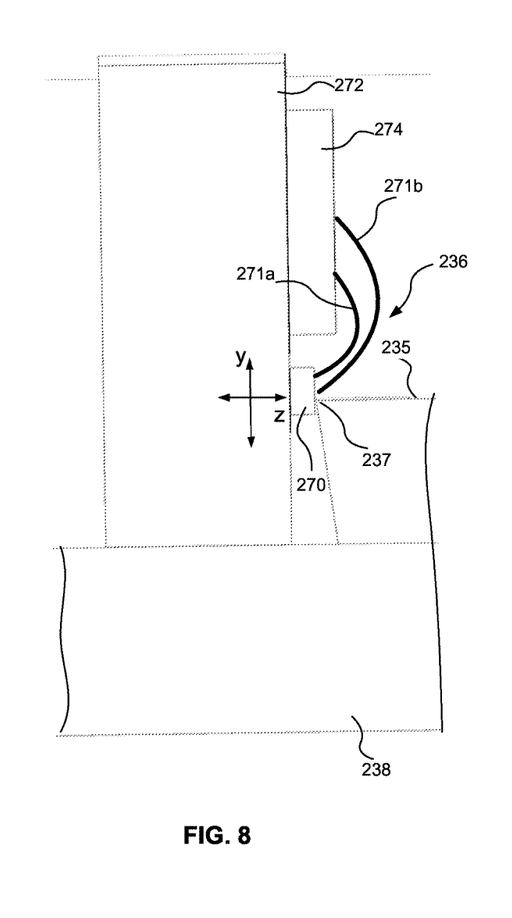
FIG. 8 is an enlarged side view of a photodetector directly optically coupled to an optical output of an optical demultiplexer and wire bonded to an associated transimpedance amplifier (TIA), consistent with an embodiment of the present disclosure.
Figure 9:
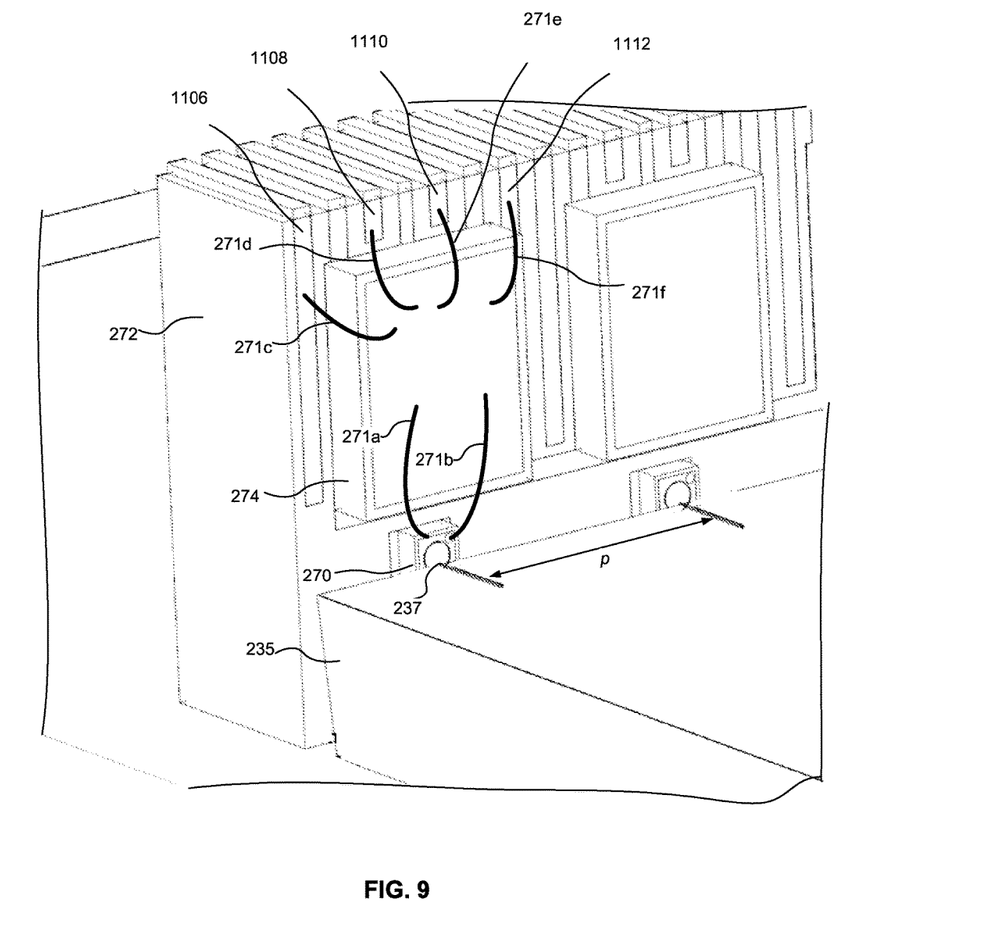
FIG. 9 is an enlarged perspective view of photodetectors directly optically coupled to optical outputs of an optical demultiplexer and wire bonded to associated TIAs, consistent with an embodiment of the present disclosure.

As shown in FIGS. 8 and 9, each of the photodiodes 270 is electrically connected to each of the TIAs 274 using wire bonding. Wires 271a and 271b extend from wire bonding points on the photodiodes 270 to wire bonding points on the associated TIAs 274. Wire 271a and 271b may, for example, connect the anode and cathode, respectively, of photodiode 270 to TIA 274. Although wires 271a and 271b are shown as attached to the top surface of the photodiode 270 in FIGS. 8 and 9, in some embodiments, one or both wires 271 and 271b may be attached to the bottom surface, adjacent to photodetector conductive pads 276 shown in FIGS. 10 and 11. Additional wires/wire bonds may also extend between various signal ports on the TIAs 274 and conductive paths or pads on the mounting bar 272. For example, wire bond 271c may electrically couple the TIA port associated with power (Vcc) to a designated pad 1106 on the mounting bar 272. Similarly, wire bonds 271d and 271e may electrically couple the TIA ports associated with the positive and negative differential output voltage to other designated pads, 1108 and 1110 respectively, on the mounting bar 272. In some embodiments, any number of additional wire bonds may be employed and associated with other TIA ports. For example, wire bond 271f may electrically couple a TIA port associated with the Receive Signal Strength Indicator (RSSI) to a designated pad 1112 on the mounting bar 272. This is illustrated in circuit block diagram form in FIG. 12, as will be discussed in greater detail below.

Although one embodiment includes six (6) wires 271 between each TIA and the associated photodiode and mounting bar pads, as shown in FIG. 9, other numbers of wires may also be used. The photodiodes 270 are designed and configured with wire bonding points arranged in a pattern (e.g., using a cross over design) such that the wires 271 do not interfere with the optical demultiplexer 235, thereby allowing the direct optical coupling with sufficient proximity to achieve the desired coupling efficiency (e.g., 95% or greater) and with a tolerance alignment high enough to allow passive alignment (e.g., at least 20 microns). In other words, the wire bonding points are arranged on the region of each of the photodiodes 270 that does not oppose the demultiplexer 235 when directly optically coupled. Where the optical multiplexer 235 is about 0.7 mm thick, for example, the wire bond points may be located on a region of the mounted photodiode 270 that extends above 0.8 mm measured from the ROSA housing bottom portion 238.

In some embodiments, the wires 271, and in particular 271a and 271b, may be configured to a minimal length needed to complete the connection, so as to reduce signal crosstalk between photodetectors (particularly adjacent photodetectors). In some embodiments, wires 271a and 271b may be less than 0.5 mm in length. The photodetectors 270 may be configured to electrically float (e.g., no direct electrical connection or coupling to ground). Allowing the photodetectors to have floating grounds in this manner may further reduce crosstalk and increase receiver sensitivity.

The photodetectors 270 associated with each of the TIAs 274 may be mounted with a pitch p (x-axis spacing) corresponding to the pitch p of the TIAs 274. In one example, the TIAs 274 and the photodetectors 270 have a pitch p on the mounting bar 272 less than 1.5 mm and more specifically about 1.375 mm. In one embodiment, the optical demultiplexer 235 may be an AWG designed with the optical outputs 237 having a pitch p matching that of the photodetectors 270 when mounted on the mounting bar 272.

Figure 10:
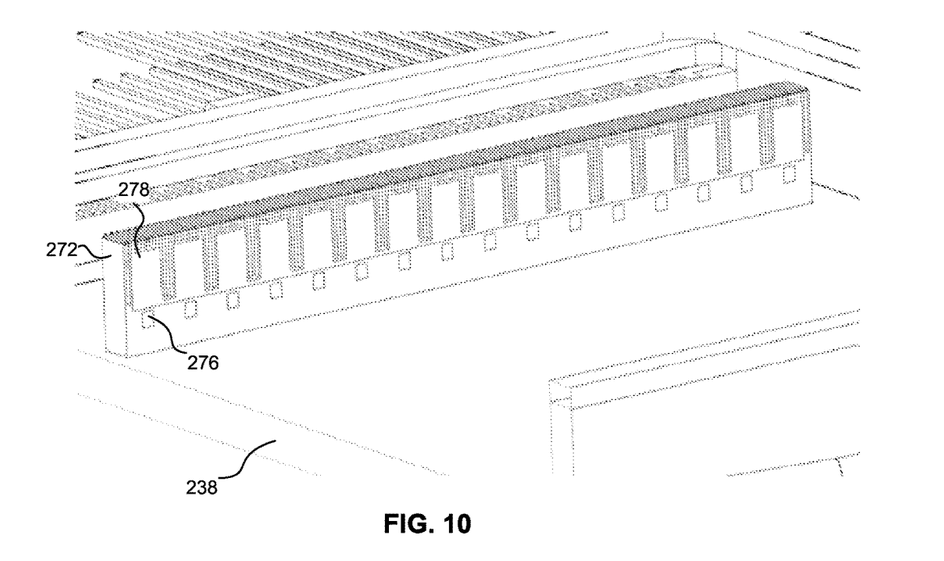
FIG. 10 illustrates the photodetector mounting bar, consistent with an embodiment of the present disclosure.
Figure 11:
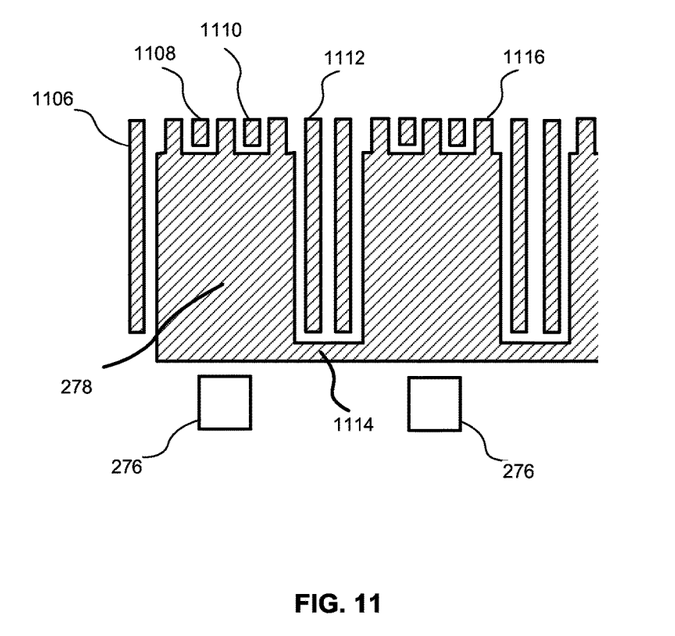
FIG. 11 illustrates an enlarged view of the photodetector mounting bar, shown in FIG. 10, with detail of the photodetector and TIA conductive pads.

Referring to FIGS. 10 and 11, the photodetector mounting bar 272 is shown mounted to the ROSA bottom portion 238 before attachment of the photodetectors and TIAs. The mounting bar 272 may be mounted using an adhesive, such as epoxy, or other suitable techniques. The mounting bar 272 includes photodetector conductive pads 276 and TIA conductive pads 278 with a pitch p corresponding to the desired pitch of the mounted photodetectors and TIAs. FIG. 11 illustrates the mounting bar in greater detail.

The photodetectors may be connected/mounted to the respective photodetector conductive pads 276 which are electrically isolated (e.g., not coupled to ground), thus allowing the photodetectors to float.

After all of the photodetectors 270 have been aligned and mounted, the TIAs may be mounted to the TIA conductive pads 278, for example, using a silver epoxy or other conductive epoxy. The photodetectors and TIAs may then be wire bonded (271a, . . . 271f) to provide the electrical connections. The TIA conductive pads 278 provide a relatively large ground surface area through which the TIAs may be coupled to a common ground (shared between the TIAs). The relatively large ground surface may reduce noise and improve signal quality, thus increasing receiver sensitivity. The common ground may be achieved through the conductive connection or bridge 1114 between each pad 278. Additional ground tabs 1116 may extend off the top edge of the pad 278 to provide convenient bonding points for any other ground attachments that may be needed. In some embodiments, the ground surface area may be at least 1 square mm.

FIG. 11 also illustrates the additional conductive paths or pads 1106, 1108, 1110, 1112 included on the mounting bar 272, to which other TIA signal ports may be wire bonded. Pads 1108 and 1110, located near the top of the TIA, may be most suitable for short wire connections to ports that are located near the top of the TIA. Pads 1106 and 1112, which extend down to the lower side of the TIA, may be most suitable for short wire connections to ports that are located near the bottom of the TIA.

In some embodiments, the photodetector and TIA conductive pads may be disposed on a long axis of the mounting bar (i.e., along the x-axis) over a length of less than 25 mm, and more specifically about 22 mm.

Figure 12:
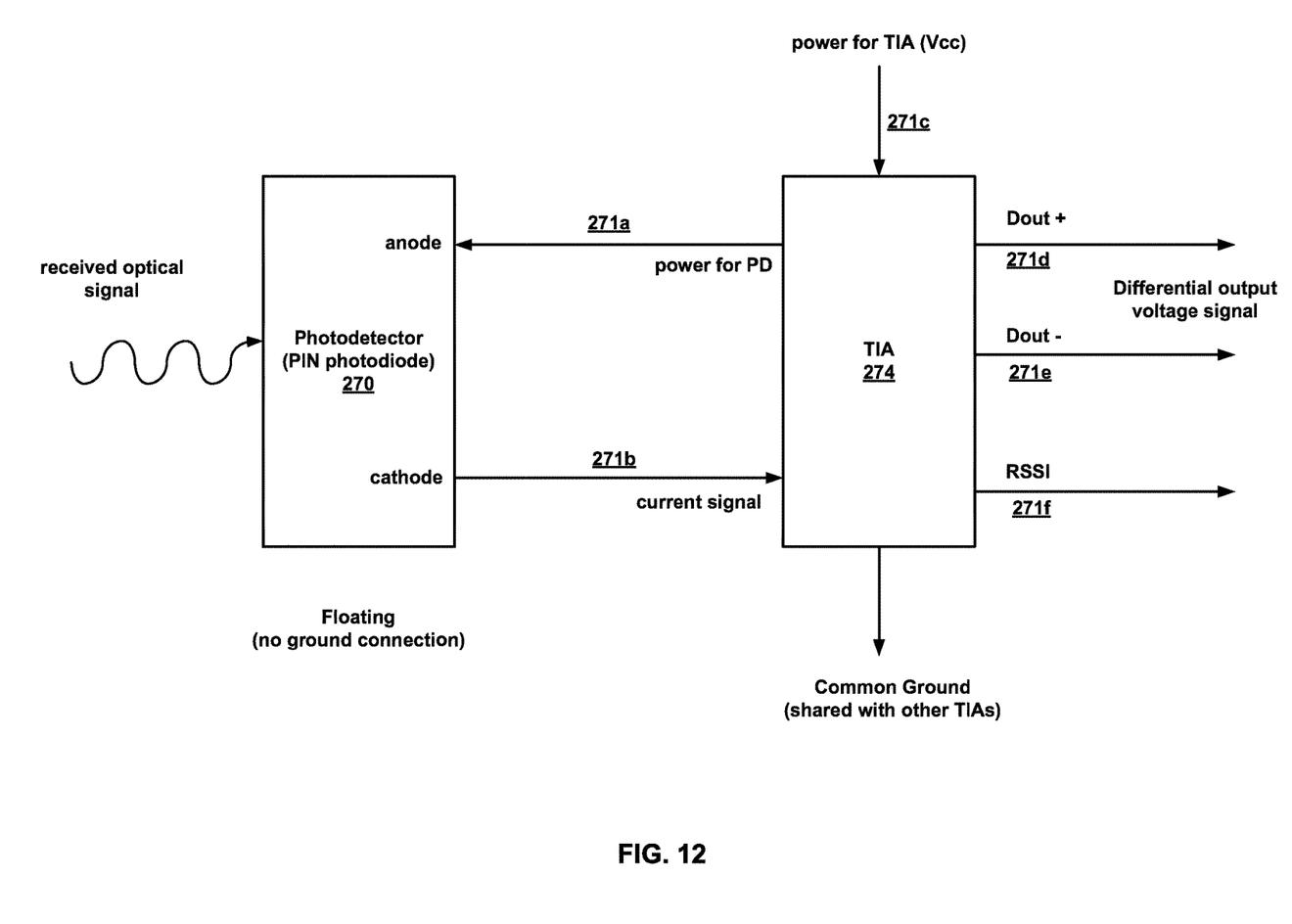
FIG. 12 illustrates a circuit block diagram of the photodetector and TIA, consistent with an embodiment of the present disclosure.

Referring now to FIG. 12, a circuit block diagram of the photodetector 270 and TIA 274 is shown. Photodetector 270 receives an optical signal from optical demultiplexer 235 and converts this into an electrical signal (e.g., an electrical current) which is supplied over wire 271b from the cathode port of the photodetector to the TIA 274. Wire 271a may be configured to provide power from the TIA 274 to the anode port of the photodetector 270 to enable operation of the photodetector. Photodetector 270, although mounted to a conductive pad 276, remains isolated from ground (e.g., configured for floating ground). TIA 274 is configured to receive the current signal from photodetector 270, amplify the signal and provide a differential output voltage (e.g., Dout +/−) on wires 271d and 271e which couple the output signal to conducting pads 1108, 110 on the mounting bar for routing to other circuitry for further processing.

TIA 274 may also be configured to receive power for operation (e.g., a supply voltage Vcc) through wire 271c that couples the TIA power port to conducting pad 1106 on the mounting bar. TIA 274 may further be configured to provide an RSSI through wire 271f that couples the TIA RSSI port to conducting pad 1112 on the mounting. The RSSI provides a mechanism for monitoring the TIA and the associated optical channel (e.g., current monitoring) to determine the strength of the signal, if any, on that channel. TIA 274 is also connected to a common ground that is shared with the other TIAs on the mounting bar. The ground connection may be accomplished through the TIA conductive pad 278 and the bridge connection 1114 to the other TIA conductive pads.

Accordingly, a multi-channel receiver optical subassembly (ROSA), consistent with embodiments described herein, includes a photodetector mounting bar providing a relatively large common ground to be shared between TIAs and further providing floating grounds for the photodetectors such that crosstalk between channels is reduced and receiver sensitivity is increased.

Consistent with an embodiment, a photodetector mounting bar includes a plurality of conductive photodetector pads (PD pads), each of the PD pads is configured to receive a photodetector, wherein the PD pads are electrically isolated from ground such that the photodetectors are at a floating ground. The mounting bar also includes a plurality of conductive transimpedance amplifier pads (TIA pads), each of the TIA pads configured to receive a TIA, associated with one of the photodetectors, and electrically coupled to one or more ground ports of the TIA, wherein the TIA pads are electrically connected to a common ground shared by each of the TIAs.

Consistent with another embodiment, a multi-channel receiver optical subassembly (ROSA) includes a ROSA housing and an optical demultiplexer located in the ROSA housing. The optical demultiplexer includes multiple optical outputs corresponding to multiple channels and is configured to receive a wavelength division multiplexed (WDM) optical signal on multiple channel wavelengths and to demultiplex the WDM optical signal to produce demultiplexed optical signals on the multiple channel wavelengths, respectively. The multi-channel ROSA also includes a photodetector mounting bar located in the ROSA housing, the mounting bar including a plurality of conductive photodetector pads (PD pads), each of the PD pads to receive a photodetector, wherein the PD pads are configured as electrically isolated from ground such that the photodetectors are at a floating ground; the photodetectors aligned with and directly optically coupled to the multiple optical outputs, respectively, of the optical demultiplexer. The mounting bar also including a plurality of conductive transimpedance amplifier pads (TIA pads), each of the TIA pads to receive a TIA, associated with one of the photodetectors, and configured as electrically coupled to one or more ground ports of the TIA, wherein the TIA pads are electrically connected to a common ground shared by each of the TIAs.

Consistent with yet another embodiment, a multi-channel optical transceiver module includes a transceiver housing having a transceiver optical connection end and a transceiver electrical connection end. The transceiver optical connection end of the transceiver housing is configured to provide an optical connection and the transceiver electrical connection end of the transceiver housing being configured to provide an electrical connection. The multi-channel optical transceiver module also includes a circuit board located in the transceiver housing proximate the transceiver housing bottom portion. The circuit board includes RF inputs located proximate the transceiver electrical connection end of the transceiver housing. The multi-channel optical transceiver module further includes a multi-channel transmitter optical subassembly (TOSA) located in the transceiver housing and electrically connected to the circuit board. The TOSA is configured to transmit a wavelength division multiplexed (WDM) optical signal on multiple channel wavelengths. The multi-channel optical transceiver module also includes a multi-channel receiver optical subassembly (ROSA) located in the transceiver housing and electrically connected to the circuit board. The ROSA is configured to receive a wavelength division multiplexed (WDM) optical signal on multiple channel wavelengths. The ROSA includes an optical demultiplexer including multiple optical outputs corresponding to multiple channels. The optical demultiplexer is configured to receive a wavelength division multiplexed (WDM) optical signal on multiple channel wavelengths and to demultiplex the WDM optical signal to produce demultiplexed optical signals on the multiple channel wavelengths, respectively. The multi-channel optical transceiver module also includes a photodetector mounting bar, the mounting bar including a plurality of conductive photodetector pads (PD pads), each of the PD pads to receive a photodetector, wherein the PD pads are configured as electrically isolated from ground such that the photodetectors are at a floating ground; the photodetectors aligned with and directly optically coupled to the multiple optical outputs, respectively, of the optical demultiplexer. The mounting bar also including a plurality of conductive transimpedance amplifier pads (TIA pads), each of the TIA pads to receive a TIA, associated with one of the photodetectors, and configured as electrically coupled to one or more ground ports of the TIA, wherein the TIA pads are electrically connected to a common ground shared by each of the TIAs.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A photodetector mounting bar comprising:
   a mounting surface;
   a first plurality of transversely spaced conductive paths extending on said mounting surface, said first plurality of conductive paths extending longitudinally from a first side of said mounting surface;
   a second plurality of transversely spaced conductive paths extending on said mounting surface, said second plurality of conductive paths extending longitudinally from said first side of said mounting surface, wherein said second plurality of conductive paths are positioned between two conductive paths of said first plurality of conductive paths;
   a conductive photodetector pad (PD pad), wherein said PD pad is electrically isolated from ground; and
   a conductive transimpedance amplifier pad (TIA pad), said TIA pad electrically connected to said ground, wherein said TIA pad is positioned between two conductive paths of said first plurality of conductive paths and is positioned between said PD pad and at least one conductive path of said second plurality of conductive paths.

2. The photodetector mounting bar of claim 1, further comprising a photodetector electrically connected to said PD pad and a transimpedance amplifier (TIA) electrically connected to said TIA pad, wherein a cathode of said photodetector and an anode of said photodetector are electrically coupled to said TIA by wire bonding.

3. The photodetector mounting bar of claim 2, wherein said wire bonding is less than 0.5 mm in length.

4. The photodetector mounting bar of claim 2, wherein said photodetector is a PIN photodiode.

5. The photodetector mounting bar of claim 1, further comprising 16 of said PD pads disposed on a long axis of said mounting bar over a length of less than 25 mm.

6. The photodetector mounting bar of claim 5, wherein a pitch of said PD pads is less than 1.5 mm.

7. The photodetector mounting bar of claim 1, wherein said TIA pad comprises a surface area of at least 1 square mm.

8. A multi-channel receiver optical subassembly (ROSA) comprising:
   a ROSA housing;
   an optical demultiplexer located in said ROSA housing, said optical demultiplexer including multiple optical outputs corresponding to multiple channels, said optical demultiplexer configured to receive a wavelength division multiplexed (WDM) optical signal on multiple channel wavelengths and to demultiplex said WDM optical signal to produce demultiplexed optical signals on said multiple channel wavelengths, respectively; and
   a photodetector mounting bar having a mounting surface, said photodetector mounting bar located in said ROSA housing and said mounting surface of said photodetector mounting bar extending transverse to said optical outputs of said optical demultiplexer, wherein said mounting surface comprises:
      a first plurality of conductive paths extending from a first side of said mounting surface;
      a second plurality of conductive paths extending from said first side of said mounting surface, said second plurality of conductive paths being positioned between two conductive paths of said first plurality of conductive paths, wherein a length of said second plurality of conductive paths measures less than a length of said first plurality of conductive paths;
      a plurality of photodetectors electrically isolated from ground such that said photodetectors are at a floating ground, said photodetectors being aligned with and optically coupled to said multiple optical outputs, respectively, of said optical demultiplexer; and
      a plurality of transimpedance amplifiers (TIAs) associated with a respective one of said photodetectors and electrically coupled to a common ground shared by each of said TIAs.

9. The multi-channel ROSA of claim 8, said photodetector mounting bar further comprising a plurality of conductive signal pads, each of said signal pads configured to be wire bonded to one or more signal ports of said TIAs.

10. The multi-channel ROSA of claim 9, wherein said signal ports include a power port, a positive differential voltage output port, a negative differential voltage output port and a Received Signal Strength Indicator (RSSI) port.

11. The multi-channel ROSA of claim 8, wherein a cathode and an anode of a respective photodetector is electrically coupled to a respective TIA by wire bonding.

12. The multi-channel ROSA of claim 11, wherein said wire bonding is less than 0.5 mm in length.

13. The multi-channel ROSA of claim 8, wherein said photodetectors are PIN photodiodes.

14. The multi-channel ROSA of claim 8, wherein said optical demultiplexer includes an arrayed waveguide grating (AWG).

15. The multi-channel ROSA of claim 8, wherein said mounting surface of said photodetector mounting bar further comprises:
   a plurality of conductive photodetector pads (PD pads), wherein said PD pads are electrically isolated from ground and electrically connected to a respective photodetector; and
   a plurality of conductive TIA pads, each of said TIA pads electrically connected to said common ground and to a respective TIA, wherein at least one of said TIA pads is positioned between two conductive paths of said first plurality of conductive paths and is positioned between at least one of said plurality of PD pads and at least one conductive path of said second plurality of conductive paths.

16. The multi-channel ROSA of claim 15, wherein 16 of said PD pads are disposed on a long axis of said mounting bar over a length of less than 25 mm.

17. The multi-channel ROSA of claim 16, wherein a pitch of said PD pads is less than 1.5 mm.

18. The multi-channel ROSA of claim 15, wherein said TIA pads comprise a surface area of at least 1 square mm.

19. A multi-channel optical transceiver module comprising:
   a transceiver housing having a transceiver optical connection end and a transceiver electrical connection end, said transceiver optical connection end of said transceiver housing being configured to provide an optical connection and said transceiver electrical connection end of said transceiver housing being configured to provide an electrical connection;
   a circuit board located in said transceiver housing, wherein said circuit board includes RF inputs located proximate said transceiver electrical connection end of said transceiver housing;
   a multi-channel transmitter optical subassembly (TOSA) located in said transceiver housing and electrically connected to said circuit board, said TOSA being configured to transmit a wavelength division multiplexed (WDM) optical signal on multiple channel wavelengths; and
   a multi-channel receiver optical subassembly (ROSA) located in said transceiver housing and electrically connected to said circuit board, said ROSA being configured to receive a wavelength division multiplexed (WDM) optical signal on multiple channel wavelengths, wherein said ROSA comprises:
   an optical demultiplexer including multiple optical outputs corresponding to multiple channels, said optical demultiplexer configured to receive a wavelength division multiplexed (WDM) optical signal on multiple channel wavelengths and to demultiplex said WDM optical signal to produce demultiplexed optical signals on said multiple channel wavelengths, respectively; and
   a photodetector mounting bar having a mounting surface, said mounting surface extending transverse to said optical outputs of said optical demultiplexer, wherein said mounting surface comprises:
      a first plurality of conductive paths extending from a first side of said mounting surface;
      a second plurality of conductive paths extending from said first side of said mounting surface, said second plurality of conductive paths being positioned between two conductive paths of said first plurality of conductive paths;

a plurality of photodetectors electrically isolated from ground such that said photodetectors are at a floating ground, said photodetectors being aligned with and directly optically coupled to said multiple optical outputs, respectively, of said optical demultiplexer; and a plurality of transimpedance amplifiers (TIAs) associated with a respective one of said photodetectors and electrically coupled to a common ground shared by each of said TIAs, wherein at least a portion of at least one TIA is positioned between two conductive paths of said first plurality of conductive paths and is positioned between at least one photodetector and at least one conductive path of said second plurality of conductive paths.

20. The multi-channel optical transceiver module of claim 19, said photodetector mounting bar further comprising a plurality of conductive signal pads, each of said signal pads configured to be wire bonded to one or more signal ports of said TIAs.

21. The multi-channel optical transceiver module of claim 20, wherein said signal ports include a power port, a positive differential voltage output port, a negative differential voltage output port and a Received Signal Strength Indicator (RSSI) port.

22. The multi-channel optical transceiver module of claim 19, wherein a cathode and an anode of a respective photodetector is electrically coupled to a respective TIA by wire bonding.

23. The multi-channel optical transceiver module of claim 22, wherein said wire bonding is less than 0.5 mm in length.

24. The multi-channel optical transceiver module of claim 19, wherein said mounting surface of said photodetector mounting bar further comprises:

a plurality of conductive photodetector pads (PD pads), wherein said PD pads are electrically isolated from ground and electrically connected to a respective photodetector; and a plurality of conductive TIA pads, each of said TIA pads electrically connected to said common ground and a respective TIA.

25. The multi-channel optical transceiver module of claim 24, wherein 16 of said PD pads are disposed on a long axis of said mounting bar over a length of less than 25 mm.

26. The multi-channel optical transceiver module of claim 25, wherein a pitch of said PD pads is less than 1.5 mm.

27. The multi-channel optical transceiver module of claim 24, wherein said TIA pads comprise a surface area of at least 1 square mm.

* * * * *